United States Patent [19]

Sefick et al.

[11] 4,145,233

[45] Mar. 20, 1979

[54] METHOD FOR MAKING NARROW CHANNEL FET BY MASKING AND ION-IMPLANTATION

[75] Inventors: Stephen A. Sefick, Dayton; Robert K. Jones, Centerville, both of Ohio

[73] Assignee: NCR Corporation, Dayton, Ohio

[21] Appl. No.: 909,868

[22] Filed: May 26, 1978

[51] Int. Cl.$^2$ .................. H01L 21/26; H01L 21/265
[52] U.S. Cl. .................. 148/1.5; 148/187; 357/23; 357/91
[58] Field of Search .......... 357/91, 23, 55; 148/1.5, 187

[56] References Cited

U.S. PATENT DOCUMENTS

| | | | |
|---|---|---|---|
| 3,863,330 | 2/1975 | Kraybill et al. | 29/571 |
| 3,873,372 | 3/1975 | Johnson | 148/1.5 |
| 3,883,372 | 5/1975 | Lin | 148/187 |
| 3,933,529 | 1/1976 | Goser | 148/1.5 |
| 3,996,655 | 12/1976 | Cunningham et al. | 29/571 |
| 4,001,860 | 1/1977 | Cauge et al. | 357/23 |
| 4,037,307 | 7/1977 | Smith | 29/571 |
| 4,038,107 | 7/1977 | Marr et al. | 148/1.5 |
| 4,078,947 | 3/1978 | Johnson et al. | 148/1.5 |
| 4,084,987 | 4/1978 | Godber | 148/1.5 |
| 4,089,712 | 5/1978 | Joy et al. | 148/175 |

OTHER PUBLICATIONS

Abbas et al, "Short Channel FET", IBM-TDB, 17 (1975), 3263.
Gdola, "Reducing Hot Carrier Injection . . .", IBM-TDB, 18 (1975), 1860.

Primary Examiner—L. Dewayne Rutledge
Assistant Examiner—Upendra Roy
Attorney, Agent, or Firm—J. T. Cavender; Lowell C. Bergstedt; Philip A. Dalton, Jr.

[57] ABSTRACT

A method for making an FET comprising as many as three parallel channels having different threshold voltages. The two outer channels can have very low W/L ratios and resulting low drain-to-source currents. In one embodiment, the FET has a central enhancement channel flanked by low W/L ratio, low current, depletion channels. This FET is fabricated by (1) forming on the field oxide a photoresist mask having a relatively narrow aperture; (2) overetching the field oxide beneath the photoresist mask aperture to form a relatively wide aperture in the field oxide, leaving a photoresist overhang; (3) implanting the substrate through the relatively narrow photoresist mask aperture to provide an enhancement section of the channel region; (4) removing the photoresist mask; and (5) depletion implanting the substrate through the relatively wide field oxide aperture. The gate structure is formed over the combined enhancement and depletion channels and a source and a drain span the ends of the channels. This effectively provides an enhancement FET which is in parallel with a depletion FET. The effective channel width of the depletion FET approximates the combined width of the two narrow depletion regions and is controlled by the photoresist overhang, i.e., by the relative width dimensions of the two mask apertures. The method is applicable to both silicon and metal gate technology, to n-channel and p-channel, and to various combinations of enhancement and/or depletion devices.

26 Claims, 13 Drawing Figures

FORM MASKING
OXIDE LAYER 16

FIG. 3

FORM PR MASK 33

FIG. 4

FORM (ETCH)
OXIDE WINDOW 36

FIG. 5

IMPLANT
ENHANCEMENT
SECTION 27

FIG. 6

REMOVE MASK 33

FIG. 7

IMPLANT DEPLETION
SECTION(S) 28, 29

METHOD FOR MAKING NARROW CHANNEL FET BY MASKING AND ION-IMPLANTATION

CROSS-REFERENCE TO RELATED APPLICATIONS

This application is related to U.S. Ser. No. 890,425, titled PLURAL NARROW CHANNEL FET AND METHOD FOR MAKING, based upon NCR docket 2631, filed Mar. 27, 1978 in the name of Robert K. Jones and Armand van Velthoven and assigned to NCR Corporation.

BACKGROUND OF THE INVENTION

This invention relates to methods for making field effect transistors and more particularly to a method for making such transistors with one or more narrow channels.

Recently, there has been much development of insulated gate field effect transistors (IGFET) which use metal insulator semiconductor (MIS) technology. The benefits of this technology include simplicity of structure and the potential for very high device density.

As such devices become increasingly smaller, it is increasingly more desirable to operate at low currents. Unfortunately, the drain to source current is proportional to the width-to-length (W/L) ratio of the device channel. One illustration of this dependency is the MOS transistor current equation, e.g., for saturation:

$$I_{DS} = -k'(W/L)(V_{GS} - V_T)^2 \quad (1)$$

where
- $I_{DS}$ = drain to source current
- W = channel width
- L = channel length
- $V_{GS}$ = gate to source voltage
- $V_T$ = threshold voltage
- $k' = (\mu_p \epsilon_{ox})/(2t_{ox})$
- $\mu_p$ = avg. surface mobility of channel holes
- $\epsilon_{ox}$ = oxide permitivity
- $t_{ox}$ = thickness of the oxide over the channel.

Obviously, the drain-to-source current could be decreased by increasing the channel length dimension relative to the width, but the disadvantages of the resulting decrease in density, decrease in operational speed, etc. would probably outweigh the benefits from the decreased current.

Another approach to decreasing the W/L ratio is to decrease the width itself. However, the lower limits of channel width are conventionally limited by the photolithographic techniques used to fabricate such devices. Typically, photolithographic resolution is in the range of several (greater than 2) micrometers.

The microelectronics industry has successfully employed several techniques to avoid the limitations of photolithography and to control channel dimensions. One approach involves using a double diffusion technique, typically in which channel-forming impurities of one conductivity type are diffused into a relatively large region of the substrate, then source- or drain-forming impurities of the second conductivity type are diffused into the channel region, but to a smaller area, to precisely define a relatively short channel between the lateral edges of the diffused regions. U.S. Pat. No. 3,845,495 issued Oct. 29, 1974 to Cauge et al. uses the same oxide mask aperture for both diffusions, and uses the relative lateral diffusion of the source and channel regions to control the positioning of their lateral edges. U.S. Pat. No. 3,883,372 issued May 13, 1975 to Lin uses a glass mask having concentric apertures and apparently controls the lateral edges of the diffused regions by the extent of lateral diffusion, in the manner of Cauge et al. U.S. Pat. No. 3,863,330 issued Feb. 4, 1975 to Kraybill et al. uses the same nitride mask aperture for both diffusions and again controls the channel length by relative lateral diffusion. U.S. Pat. No. 4,038,107 issued July 26, 1977 to Marr et al. forms the source through an oxide mask aperture, forms the channel through a smaller polysilicon mask aperture, oxidizes the polysilicon mask, and then forms the drain through the still smaller, oxidized polysilicon mask aperture.

In another approach, U.S. Pat. No. 4,037,307 issued July 26, 1977 to Smith uses a mask of abutting silicon dioxide and metal oxide and forms an aperture therein by etching the silicon dioxide away from the silicon dioxide-metal oxide interface. The mask aperture is then used to form a narrow gate electrode, and the gate electrode itself is used as a mask to form a closely spaced (short channel) source and drain.

Regardless of the success of these approaches, it is apparent that this exemplary prior art is not directed to the problem of decreasing channel width.

SUMMARY OF THE INVENTION

The present invention is an improvement of the invention disclosed in aforementioned U.S. Ser. No. 890,425, PLURAL NARROW CHANNEL FET AND METHOD FOR MAKING. Typically, the aforementioned application forms multi-channel, low W/L ratio devices by forming a mask on the thick field oxide formed over a semiconductor substrate; using the mask to form a relatively narrow aperture in the field oxide over the channel region of the substrate; removing the mask; implanting threshold voltage-controlling impurities in the substrate channel region via the oxide aperture; overetching the oxide aperture beneath the mask to increase the width of the oxide aperture; and implanting threshold voltage-controlling impurities in the channel region via the enlarged oxide aperture. This last step is optional.

The present invention forms both of the deposition-defining mask apertures prior to deposition. This is done by forming on the field oxide a mask (typically of photoresist) having a relatively narrow aperture; and overetching the field oxide through the mask to form a relatively wide aperture in the oxide. The deposition process is then applied after both apertures hve been formed. This process eliminates the step of forming the relatively narrow oxide aperture. As will be appreciated by those skilled in the art, the elimination of a process step is highly desirable, in that it significantly reduces the cost of forming a semiconductor device.

To illustrate the process of the present invention, a photoresist mask having a relatively narrow aperture is formed on the field oxide to define a first section of the substrate channel region; a relatively wider aperture is formed in the field oxide by liquid bath etching via the mask aperture to define at least a second channel region section extending along the side of the first section; impurities of one conductivity type are deposited in the channel region via the relatively narrow photoresist mask aperture to encompass the first section of the channel region; and the photoresist mask is removed. The gate electrode is then formed spanning both the first and the second sections.

Prior to the formation of the gate electrode, a second deposition step may be applied to dope the second section to a different concentration and/or conductivity type than the first section and provide various parallel combinations of enhancement channel sections and/or depletion channel sections having two threshold voltages.

Alternatively, the field oxide aperture is formed to provide a pair of outer channel sections (rather than the single second section) extending along opposite sides of the first section, and the conductivity type and relative doping level of the three sections are tailored as described above to provide as many as three different threshold voltages.

The dimensional control provided by etching permits forming each of the outer sections to a very narrow width, thus providing low current transistor action for these sections.

DETAILED DESCRIPTION

Figure 1:
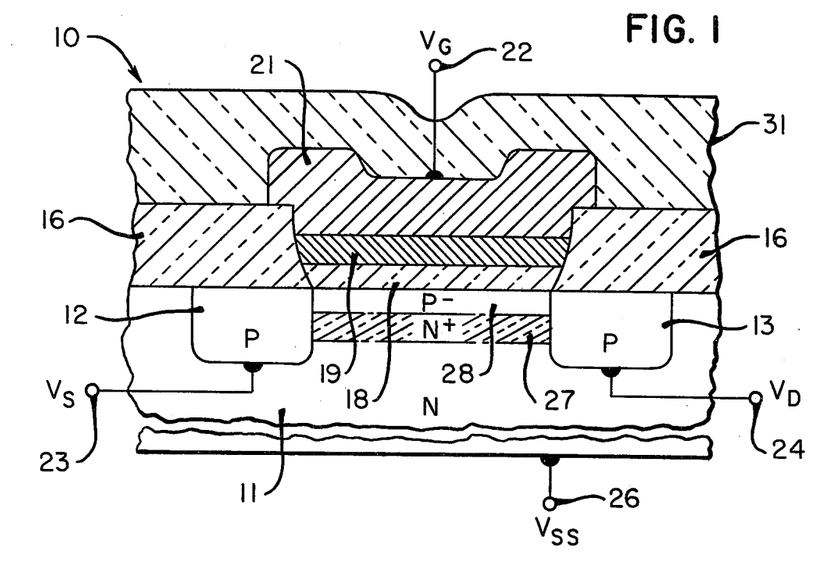
FIG. 1 is a cross-sectional view, taken parallel to the channel, of an MNOS insulated gate field effect transistor embodying the principles of the present invention.

FIG. 1 is a cross-sectional view taken parallel to the channel of a low current MNOS (metal-nitride-oxide-semiconductor) metal gate field effect transistor 10 embodying the principles of the present invention. The transistor 10 is exemplary of a class of MIS (metal-insulator-semiconductor) devices which embody the principles of the present invention. The transistor 10 comprises a substrate 11 of one conductivity type (illustratively n-type) within which spaced-apart surface-adjacent regions of the second, opposite conductivity type (p-type) form source and drain 12 and 13. A thick insulating layer 16, typically of silicon dioxide, is formed on the substrate 11 for electrically isolating the device 10. A gate structure comprising a layered dual insulator and a gate electrode 21 overlies the channel region between the source 12 and the drain 13. The insulator itself comprises silicon dioxide layer 18 and a silicon nitride layer 19.

For purposes of illustration, electrical contacts 22, 23, 24 and 26 are shown connected to the metal gate 21, source 12, drain 13 and substrate 11, respectively, for applying bias voltages which control the conduction path and current across the channel region. Those skilled in the art will understand that the particular electrical contact arrangement is shown merely to facilitate description, and that usually contact is made at a single point along each of a pair of diffusion stripes which comprise the source and drain for a plurality of devices.

The thicknesses and other dimensions shown for transistor 10 are selected for clarity of illustration and are not necessarily to scale. Typical thicknesses, dictated by the current state of the art, are: source 12 and drain 13 junction depth, about 2-2.5 microns (20,000-25,000 Angstroms) for p-channel (illustrated) and one micron for n-channel); field oxide 16, about 1.0-2.0 microns (10,000-20,000 Angstroms); gate oxide 18 about 0.04-0.05 microns (400-500 Angstroms); silicon nitride layer 19 about 0.03-0.05 microns (300-500 Angstroms); and metal gate electrode 21, about 1-1.5 microns (for a conductor such as aluminum). Also, the gate structure length (measured along the longitudinal dimension of the channel between the source and drain parallel to the plane of the drawing) and width (measured laterally of the channel length perpendicular to the plane of the drawing) are typically about 10 microns by 5 microns, but may be varied. At least some of these dimensions, such as junction depth, can be expected to decrease with improvements in process technology. In any event, it is obvious that meaningful scale representation of such widely varying dimensions is impossible within relatively small drawing space.

Figure 7:
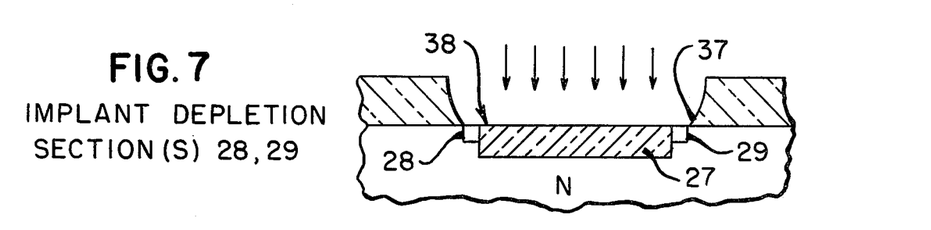
Figures 8, 10, 11, 12, 13:
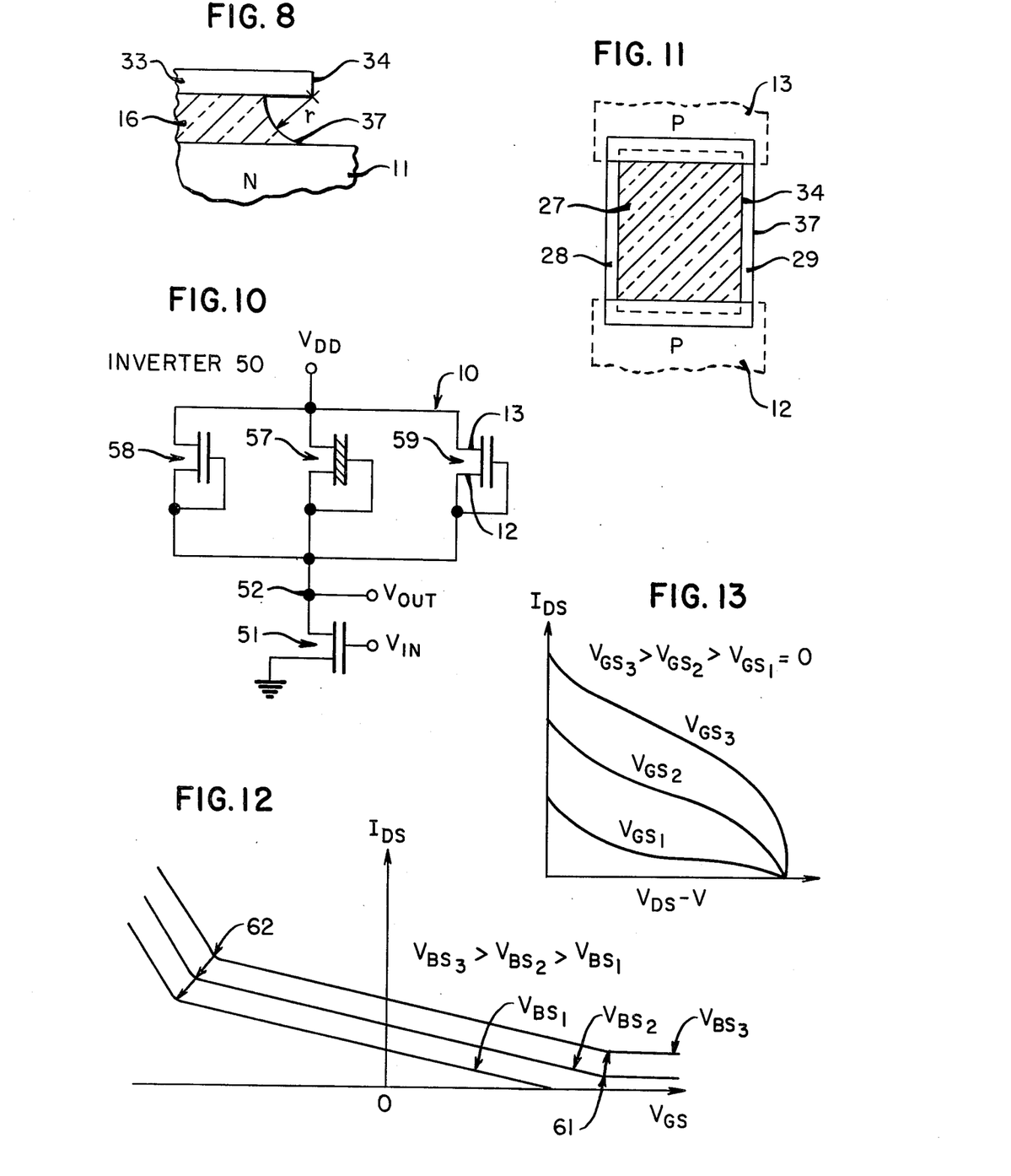
FIG. 8 is a partial, cross-sectional representation in the manner of FIG. 4, particularly illustrating the curvature of the etched oxide.
FIG. 10 is a schematic of an inverter circuit which utilizes the low current device of the present invention.
FIG. 11 is a top view of FIG. 7, in schematic form, showing the mask cuts and channel section outline in relation to the source and drain.
FIGS. 12 and 13 illustrate exemplary operating characteristics of devices constructed using the method of the present invention.

Referring further to FIG. 1, and also to FIGS. 7 and 11, the illustrated transistor 10 is characterized by a channel region having a relatively large enhancement section 27 (n-type section for the n-type substrate) extending the length thereof and in parallel with one or two relatively narrow depletion sections 28 and 29 (p-type sections for the n-type substrate) which flank the enhancement section 27 at the sides thereof and also extend the length of the channel. As indicated by equation (1), the width of the enhancement section and the depletion sections(s) can be varied to control the relative current magnitudes associated with the transistor action of the enhancement section and depletion section(s). Moreover, the process of the present invention can be used to provide depletion (or enhancement) sections 28 and 29 of very narrow, precisely controlled width and, thus, uniform reproducible low current depletion (enhancement) mode field effect transistors.

The inventive method is applicable to any type of device which can be formed by deposition through oxide masks and photoresist masks, although it is particularly applicable to field effect transistors. The inventive process is illustrated by the process of forming the insulated metal gate field effect transistor 10 of FIG. 1 (FIGS. 2-7).

Figure 2:
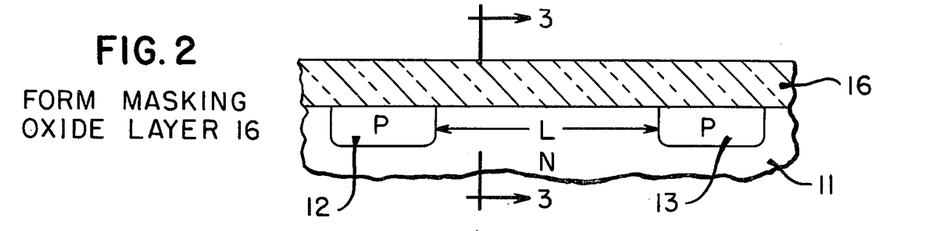
FIGS. 2-7 are cross-sectional representations of the field effect transistor of FIG. 1 during sequential stages of fabrication using the process of the present invention.

FIG. 2 illustrates a typical starting point for the dual pre-deposition mask, deposition process of the present invention. At this point, the partially-formed structure for transistor 10 comprises n-type substrate 11 having p-type source 12 and drain 13 formed in spaced apart surface-adjacent regions thereof and thick field oxide 16 formed thereon. The figure is a cross-sectional view showing the length L of the channel region between the source and drain. Typically the partially-formed structure is formed by growing field oxide 16 on a major surface of an n-type semiconductor wafer 11, etching spaced-apart source and drain "cuts" in the oxide, and depositing p-type impurities into the substrate major surface via the "cuts" to form the source and drain.

Briefly, as applied to the transistor 10, the crucial steps of the method of the present invention are (1) forming on the field oxide 16 a photoresist mask having an aperture of width less than the desired width of the channel region; (2) overetching the field oxide beneath the photoresist mask aperture to form in the field oxide an aperture which has sides spaced a predetermined distance or distances from the sides of the photoresist mask apertures; (3) implanting the substrate through the photoresist mask aperture to provide an enhancement section of the channel region; (4) removing the photoresist mask; and (5) depletion implanting the substrate through the field aperture.

Figure 3:
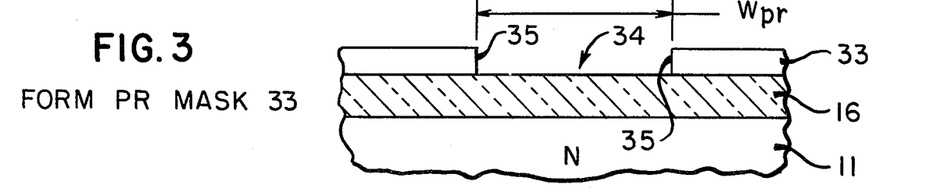

FIG. 3 is a cross-sectional view taken at right angles to FIG. 2, parallel to the channel width, illustrating the first step of the invention. Conventional photolithographic techniques are used to form on field oxide 16 a photoresist mask 33 having etch window or aperture 34. The mask 33 can be a standard potoresist material, such as AZ 111 (a liquid positive resist available from Hunt Chemical Corporation, Palisades Park, N.J., which may be applied to the field oxide 16, spun to promote a uniform coating, and then dried and baked. The photoresist layer may then be exposed to ultraviolet light through a mask (not shown), developed to remove the exposed areas (positive resist) or unexposed areas (negative), and the developed layer 33 hardened by baking. The resulting photoresist mask aperture 34 defines the length of the channel region, but the width $W_{pr}$ of the aperture, as defined by the distance between the sides 35—35 thereof, is smaller than the channel region width.

Figure 4:
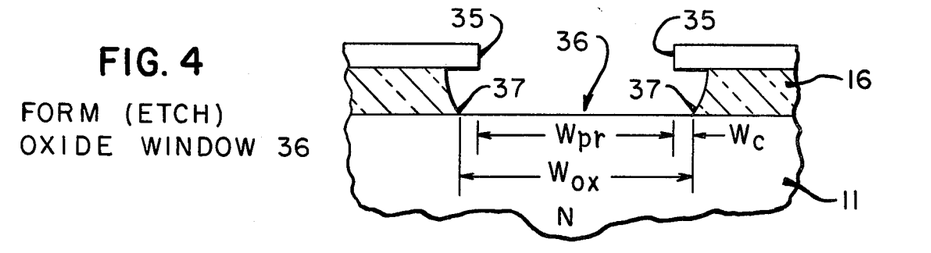

As illustrated in FIG. 4, the second mask formation step (also the second process step) involves time-controlled etching of the field oxide to form a second, field oxide aperture 36. The field oxide aperture 36 has channel region width-defining sides 37—37, at least one of which is positioned the distance $W_c$ outside the corresponding side of the photoresist mask aperture 34. This provides a field oxide aperture of effective masking width $W_{ox}$ which is greater than the photoresist mask aperture width $W_{pr}$ by the distance $W_c$ (or 2 $W_c$). This is the crucial step, for the relative positioning of the aperture edges and the resulting distance $W_c$ determine the width of the depletion sections 28 and 29.

It should be noted that, as used here, reference to the oxide aperture width $W_{ox}$ being larger than the mask aperture width $W_{pr}$ means that at least one of the sides 37—37 is positioned outside the corresponding one of the sides 35—35. Also, reference to sides 37—37 is to the effective masking boundaries of the sides or edges 37—37. It will be obvious to those skilled in the art that the non-ideal (non-vertical) edges which define the field oxide mask aperture 36 do not provide a fully effective mask to the precise physical edge thereof. In fact, there will be narrow, sloped regions of the deposited species beneath the oxide mask adjacent the edges thereof. Oxide aperture width $W_{ox}$ is thus the effective non-masking width of the oxide aperture.

FIG. 8 illustrates diagrammatically the effect of applying a liquid bath etchant via the photoresist mask aperture 34 to the field oxide 16 long enough to etch the field oxide just to the surface of the substrate 11. The resulting curved oxide profile is approximate by a semicircle having a radius of curvature r with the origin located at the edge of the photoresist mask. That is, by applying etchant until the silicon dioxide is etched just to the substrate surface, the lower edge of the oxide adjacent the substrate surface (the effective oxide mask edge 37) is aligned with the edge 34 of the photoresist mask. Silicon dioxide is hydrophilic and silicon is hydrophobic. Thus, a convenient technique for etching the silicon dioxide just to the silicon surface, and therefore just to the edge of the photoresist mask aperture, is to continue the etching process until the exposed surface becomes hydrophobic (termed "etched until 'dewet'"). This provides $W_{ox} = W_{pr}$, i.e., $W_c = 0$.

To provide field oxide aperture sides 37—37 spaced outside the sides of the photoresist mask aperture, etching is continued for a short time after the "dewet" condition. Consider, as an example, the process of forming channel sections 28 and 29 to about 0.5 microns width when the field oxide is about 1.8 microns thick. One suitable etchant is a conventional, 1:7 buffered hydrofluoric acid mixture comprising a 1:7 ratio by volume of hydrofluoric acid in ammonium fluoride. This etchant can be applied, to the wafer, e.g., at 32±1° C. for about 20 seconds after the dewet condition (approximately 12 minutes total). The buffered HF etchant removes silicon dioxide at a relatively slow, constant, reproducible rate (at about 1500 Angstroms per minute at 32° C.), and permits forming the section(s) to very narrow, reproducible widths. It is thus possible to consistently form the effective mask spacing $W_c$ and the width of each section 28 and 29 to about 0.1 micron. Of course, the constituents, ratios and temperature of the etchant can be varied to control etch rate and time.

Figure 5:
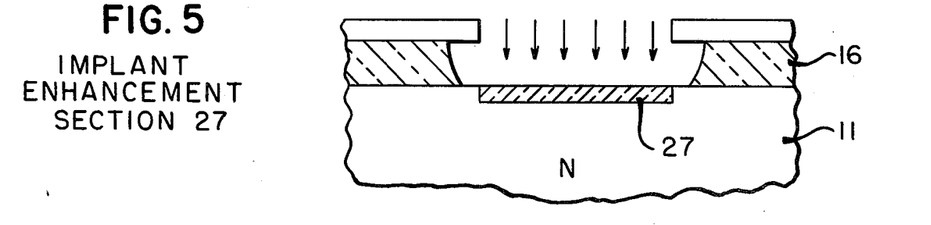

As shown in FIG. 5, the third step (the first deposition step) involves forming the enhancement channel section 27 in the substrate 11 by deposition through the photoresist mask aperture 34. This enhancement deposition may conveniently be done by ion implantation using n-type impurities such as phosphorus for the illustrated n-type substrate.

Figure 6:
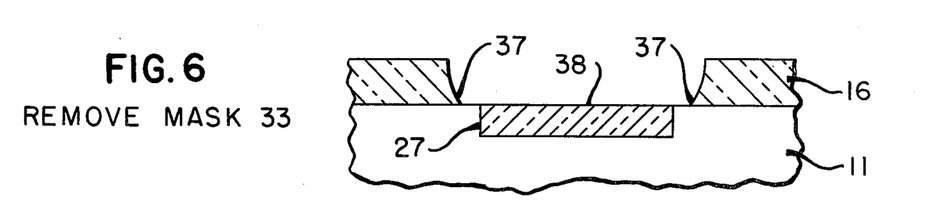

The photoresist mask 33 can be removed now, after the first deposition step, as shown in FIG. 6 by dissolution in a material such as acetone (for positive resists).

As shown in FIG. 7, the next crucial step is the second or depletion deposition (step five of the process). This deposition also may be conveniently done by heat diffusion or by ion implantation. Here, p-type impurities such as boron are used to form the depletion sections in the n-type substrate. The p-type impurities are deposited in sufficient concentration to provide the desired depletion threshold voltage characteristics in sections 28 and 29 without converting the enhancement threshold voltage characteristics of section 27. The resulting relationship of the channel sections 27, 28 and 29 and the sides 35 and 37 of the mask apertures to source 12 and drain 13 is shown in FIG. 11, which is a schematic representation of a top view of FIG. 7.

It may be convenient to subject the wafer to a heating cycle at this point to activate the implanted species and/or to anneal structural damage caused by the implantation steps and/or to promote greater adhesion of photoresist in a subsequent process step, if desired. In other cases, one or more of these objectives may be accomplished by subsequent process steps. For example, subsequent growth of the gate oxide can provide self-annealing.

The structure is completed to the MNOS metal gate field effect transistor 10, FIG. 1, by forming gate oxide 18 over the active area 38 (FIG. 7); adding silicon nitride layer 19; forming metal gate 21 to encompass the device active area; and forming the electrical contacts. A passivation layer 31 of material such as silicon dioxide may also be applied. These procedures are very well understood in the art and need not be described in detail.

EXAMPLE

Using the above procedures, an exemplary low current depletion mode, metal gate transistor 10 was formed as the load device of an MNOS inverter circuit. The silicon substrate was doped to provide a $10^{15}$ cm$^{-3}$ background concentration of phosphorus. The active area 38 (channel region width and length) was about four microns by sixteen microns. The source and drain comprised $5 \times 10^{18}$ cm$^{-3}$ surface concentration of boron formed to a junction depth of about 2.0 microns. The field oxide was 2.0 microns thick. The mask 33 was of AZ111 liquid positive photoresist (available from Hunt Chemical Corporation, Palisades Park, N.J.), which was applied to the field oxide 16; spun at 4500 rpm to promote a uniform coating; air dried; and baked at 90° C. for twenty minutes to drive off solvents and harden the resist coating. A mask was then applied to the resist coating 33 to cover the resist outside the aperture area. The resist aperture area was then exposed through the mask to ultraviolet light from a mercury vapor lamp. The exposed resist was developed in AZ-303A developer, (also available from Hunt Chemical Corporation) to remove the exposed resist. The developed photoresist layer was hardened by baking at 90° C. for twenty minutes in dry nitrogen flowing at about 5 liters per minute. The resulting photoresist mask aperture 34 was about four microns wide.

Next, the photoresist mask aperture 34 was used to form the field oxide aperture 36. This second aperture-forming step used the 7:1 buffered HF liquid etchant bath. For the two micron (20,000 Angstroms) thick field oxide, it was determined that application of the buffered HF etchant for approximately thirteen minutes (specifically, to satisfy the condition dewet + 20 seconds) provided an effective oxide aperture width $W_{ox}$ of about 5 microns, and $W_c$ for each channel section 28 and 29 of about 0.5 micron.

The first, enhancement deposition (FIG. 5) was by ion implantation of phosphorus using a dose of $3 \times 10^{12}$ cm$^{-2}$ and 50 kev. The mask 33 was then dissolved in acetone (FIG. 6). The depletion deposition was by ion implantation (FIG. 7) of boron at a dose $3.5 \times 10^{12}$ cm$^{-2}$ and energy of 20 kev. The wafer was then baked at about 1000° C. for 15 minutes in a non-oxidizing (nitrogen) atmosphere. The resulting enhancement section 27 had a peak concentration of about $5 \times 10^{17}$ atoms cm$^{-3}$ of phosphorus at a depth of about 60 nanometers. The depletion regions 28 and 29 were each effectively about 0.5 micron wide and contained $4 \times 10^{17}$ peak boron atoms per cm$^{-3}$ at a depth of about 60 nanometers. The threshold voltage of the enhancement channel region was −2.5 volts, while the threshold voltage of the depletion channel regions was +3.5 volts.

The schematic of the resulting inverter circuit 50 is shown in FIG. 10. The inverter 50 comprises switching transistor 51 and transistor 10, which is used as the load. Transistor 51 can be a conventional transistor, such as transistor 40, FIG. 9, without narrow channel structure. Transistor 10 comprises a parallel array of transistors 57, 58, and 59, which represent the transistor action associated with enhancement section 27, and depletion sections 28 and 29, respectively. The threshold voltages of the enhancement and depletion channel sections are such that the enhancement section 27 is "off" during operation of the inverter circuit, while the depletion sections 28 and 29 are "on". Consequently, the transistors associated with the depletion sections constitute the load.

In operation, increasing (decreasing) $V_{IN}$ to the gate of the input transistor 51 causes $V_{OUT}$ to drop (rise). Characteristically, the drain current, $I_{DS}$, associated with the load is needed only to maintain charge on node 52. This current requirement is much less than a microamp and any additional current is not useful and in fact is a detriment in that it dissipates power. Exemplary prior art FET inverters using a load transistor equivalent to transistor 10 (in structure, dimensions, materials), but without the low W/L channel depletion sections, have drain currents of about 15-20 microamperes for $V_{DD} = 17$ volts. In contrast, for the same $V_{DD}$, the transistor 10 has a drain current of only 5 microamperes (about 2.5 microamperes for each of two equal, depletion sections 28 and 29). Since power is proportional to the current, the threefold or fourfold decrease in current provided by load transistor 10 provides a like decrease in power dissipation.

The curves of FIG. 12 show channel current $I_{DS}$ as a function of the gate-source voltage $V_{GS}$ for different values of substrate-source voltage, $V_{BS}$. The channel current is relatively low during operation of the low W/L transistors 58 and 59, as shown by sections 61-62, and increases sharply to the left of the threshold of transistor 57 at point 62. The operating point of the device 50 of FIG. 10 is along the y-axis, where $V_{GS} = 0$.

It should be noted that the inverter 50, FIG. 10, is essentially one half of a flip-flop arrangement suitable for use in static RAM cells and that the transistor 10 is well suited for use as the load device in such an arrangement. Exemplary RAM structures to which the present low W/L device is applicable are taught in U.S. Pat. No. 3,651,492, titled NONVOLATILE MEMORY CELL, issued Mar. 21, 1972, and U.S. Pat. No. 3,676,717, titled NONVOLATILE FLIP FLOP MEMORY CELL, issued July 11, 1972, both in the name of George C. Lockwood and assigned to NCR Corporation. These patents are incorporated by reference.

Transistors made according to the present method need not be limited to low current operation. For example, by grounding the substrate of the exemplary device 50, FIG. 10, increasing $V_{GS}$ from 0 volts provides a continuum of increasing $I_{DS}$ values. See FIG. 13. This provides circuit designers the option of selecting from a range of $I_{DS}$ values provided by the low W/L and high W/L sections of the device.

As shown in the Table, the channel region sections 28-27-29 are not limited to the above depletion-enhancement-depletion array. The exemplary depletion-enhancement-depletion array is the Type I array in the Table.

To illustrate another embodiment of the process for forming a p-channel device, a heavy enhancement implant (n-type implant for the n-type substrate) could be made in the middle of the transistor in channel section 27 and no implant made in the narrow side sections 28 and 29. For example, after forming the photoresist mask 33 (Step 1, FIG. 3) and the field oxide aperture 36 (Step 2, FIG. 4); phosphorus atoms are implanted through the aperture to form an enhancement section 27 (Step 3, FIG. 5); the photoresist mask 33 is removed (Step 4, FIG. 6); the second deposition step (Step 5, FIG. 7), is omitted; and the gate structure is formed encompassing the field oxide aperture 36. This procedure can be used to form relatively low magnitude threshold voltage enhancement sections 28 and 29 at the sides of relatively high magnitude threshold voltage enhancement section 27. This structure is Type II in the Table.

TABLE

| ARRAY TYPE | CHANNEL SECTION ARRANGEMENTS | | |
|---|---|---|---|
| | CHANNEL SECTION | | |
| | 28 | 27 | 29 |
| I | depletion[2] | enhancement[1] | depletion[3] |
| II | enhancement[2] | enhancement[1] | enhancement[3] |
| III | enhancement[2] | depletion[1] | enhancement[3] |
| IV | depletion[2] | depletion[1] | depletion[3] |

An alternative approach for effecting a Type II structure would be to do enhancement implants in both the first and second deposition steps. This procedure provides relatively heavy enhancement doping in section 27 and relatively light enhancement doping in sections 28 and 29.

A Type III structure could be formed by exchanging the enhancement and depletion implants for the exemplary p-channel transistor 10. For example, after forming the aperture or window in mask 33 (Step 1, FIG. 3) and in the field oxide 36 (Step 2, FIG. 4), p-type ions such as boron would be implanted in the n-substrate through the photoresist mask aperture 34 to form depletion region 27 (Step 3, FIG. 5), then the mask 33 would be removed (Step 4, FIG. 6); and n-type ions such as phosphorus would be implanted through the field oxide aperture 36 to form enhancement sections 28 and 29 in the n-substrate.

Where the background doping level of the substrate provides a suitable enhancement mode threshold voltage for sections 28 and 29, the above procedure for the Type III structure can be modified by omitting the second, enhancement implant (Step 5) in a manner similar to that of the first embodiment of the process for forming the Type II structure.

Still another structural arrangement involves a depletion-depletion-depletion structural arrangement, Type IV in the Table. To illustrate one approach embodying the present invention, after forming the photoresist mask aperture 34 and field oxide aperture 36, a first depletion implant of p-type ions is made in the middle transistor section 27, then the mask 33 is removed, and another depletion implant is made. This provides depletion side sections 28 and 29 of relatively low magnitude threshold voltage surrounding depletion center section 27 of relatively high magnitude threshold voltage.

A transistor having only two channel sections is also possible. For example, the photoresist mask could be removed from one side of the channel prior to the deposition steps. The first implant (Step 3, FIG. 5) could then be applied to form a channel section 27. Then, the mask 33 would be removed from the opposite side of the channel and the second implant (Step 5, FIG. 7) would be used (or omitted) to form the single section 28 or 29 at the opposite side of the channel.

The reader will note that superscripts are used in the Table. They indicate the possible different threshold voltages within each array and that like mode channel sections (enhancement or depletion), as well as different mode sections, can be formed to have different threshold voltages by controlling their relative doping levels. For example, and referring further to the transistor 10 in FIG. 1, transistor channel depletion sections 28 and 29 of structural Type I can be formed with different threshold voltages by masking one of the sections during a part of the second deposition step to provide different doping levels. The superscripts in the Table also indicate that both the arrays II and IV based upon a single mode of transistor action (enhancement or depletion) and the arrays I and III based upon two different modes can have as many as three different threshold voltages. Those skilled in the art will also appreciate that the arrays listed in the Table are not intended to exhaust the possibilities, for there are an infinite number of possible threshold voltage combinations which include such other arrangements as enhancement-enhancement-depletion and depletion-depletion-enhancement.

The transistor 10 can be n-channel also. For n-channel (p-type substrate), a Type I structural arrangement having small W/L, low current depletion action could be provided by doing the dual, pre-deposition masking steps, then implanting p-type ions such as boron to form enhancement section 27 in the manner of FIG. 4, removing the mask 33 (FIG. 6), then implanting n-type ions such as phosphorus to form depletion sections 28 and 29 in the manner of FIG. 7. Alternatively, an n-channel Type III array having low W/L, low current enhancement action is provided by using n-type ions for the first implantation step and p-type ions for the second implantation step to form a depletion section 27 flanked by narrow enhancement sections 28 and 29.

Furthermore, the Type III enhancement structures and the Type IV depletion structures can be formed in the manner of the above p-channel embodiments by using p-type and n-type ions for the enhancement and depletion structures, respectively. In short, the various methods for producing the p-channel arrangements are applicable to n-channel by switching the conductivity type of the dopants.

The transistor 10 of FIG. 1 is non-memory MNOS for conventional operating voltages. The device can be made memory MNOS by using a thin gate oxide 18 of, e.g., 20–60 Angstroms thickness. Furthermore, a thick, non-memory oxide section can be formed at either the source or the drain side of the memory oxide 18 or both to control the threshold voltage and to prevent zener breakdown between the source and substrate and/or the drain and substrate. The resulting "split gate" and "trigate" structures are described more fully in U.S. Pat. No. 3,719,866 issued to Naber and Lockwood and assigned to NCR Corporation. This patent is incorporated by reference.

Figure 9:
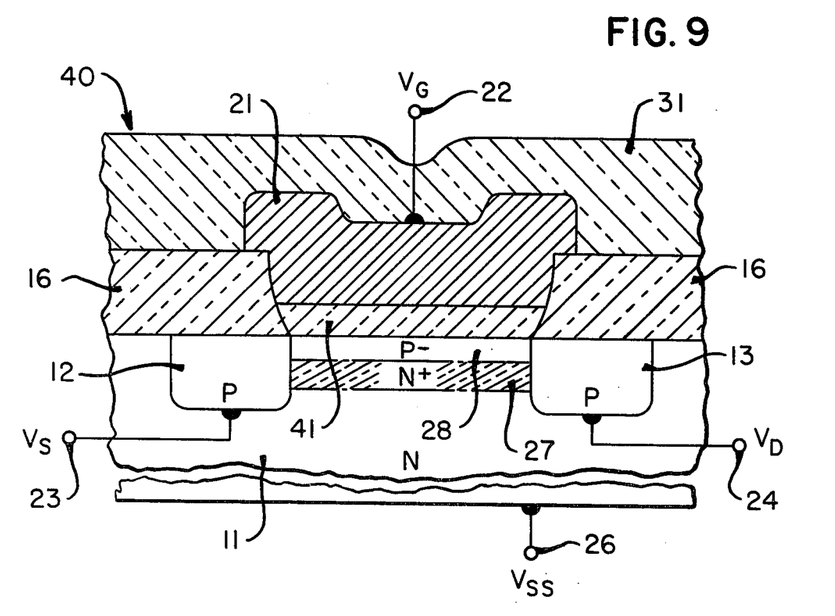
FIG. 9 is a cross-sectional view, taken parallel to the channel, of an MOS insulated gate field effect transistor embodying the principles of the present invention.

FIG. 9 shows another example of an MIS structure, a standard MOS field-effect transistor 40, which is made using the present process. Equivalent elements of MOS transistor 40 are given the same numerals as the MNOS transistor 10. The essential difference between the two structures is that nitride layer 19 is omitted in transistor 40 and a gate oxide 41, e.g., of 0.1 microns (1000 Angstroms) thickness is used so that the MOS gate structure is inherently non-memory. Those skilled in the art will realize that the 0.1 micron thickness is merely by way of example and that a wide range of non-memory thicknesses can be used.

Forming the transistor 40 involves essentially the same process as does transistor 10. Starting with the partial structure shown in FIG. 2, steps 1 to 5 of the present invention are used to form the low W/L ratio structure shown in FIG. 7. Then, the MOS transistor 40 is completed by forming the gate structure, i.e., forming the gate oxide 41 over the active device area 38 and forming metal gate 21 to encompass the active device area; forming the electrical contacts; and, if desired, forming passivation layer 31.

The present method is applicable to technologies other than metal gate. One such technology is silicon gate. The partially-completed FIG. 7 structure can be formed to an SOS (silicon-oxide-semiconductor) version of FET 40 by forming the gate oxide 41; adding a polysilicon gate (typically about 0.5 micron or 5,000 Angstroms thick); adding the electrical contacts; and, possibly forming passivation layer 31 of silicon dioxide or other material.

The silicon-oxide-semiconductor transistor can also be memory SNOS (silicon-nitride-oxide-semiconductor) or non-memory SNOS; and n-channel or p-channel. The structure types shown in the Table can be made by modifying Steps 2–5 in the same manner as discussed for the metal gate transistor 10.

Thus, there has been described a low-current, semiconductor device and the process for forming the device. The device can be n-channel or p-channel and uses controlled widening of a deposition mask to form very narrow channel sections at one or both sides of a "center" channel section. The threshold voltages of the narrow sections may be different from one another as well as from that of the center section. Although surface field effect transistors have been described, other types of field effect transistors and, indeed, other types of structures can be formed using the present process. For example, the source and/or drain can be omitted if charge-coupled techniques are employed. Furthermore, the present process is applicable to MIS structures having a gate dielectric comprising one (e.g., FIG. 9) or a plurality (e.g., FIG. 1) of insulative layers. The process is not limited to silicon oxide or silicon oxide-silicon nitride gate insulator materials. Other materials such as aluminum oxide are well-known in the art and may be used in the gate insulator.

Having thus described preferred and alternative embodiments of the present invention, what is claimed is:

1. In a method for forming a semiconductor device having an electrode structure formed over a channel region in a semiconductor body, the semiconductor body having a layer of oxide formed over the channel region thereof, the improvement wherein the channel region comprises at least two sections having different threshold voltages, including a section having an effective width of a predetermined dimension, comprising:
    forming a mask over the oxide layer on the semiconductor body, the mask having a first aperture having sides such that the width of the aperture is less than the channel region width;
    etching the oxide layer via the first aperture to form a second aperture therein, at least one side of the second aperture being spaced a predetermined distance outside the corresponding side of the first aperture;
    depositing in the semiconductor body via the first aperture impurities of a first conductivity type to form a first channel region section extending the length of the channel region and having a width smaller than the width of the channel region;
    removing the mask; and
    forming the electrode structure to encompass the aperture of the masking oxide layer.

2. The method of claim 1 wherein the oxide etching step forms each of opposite sides of the second aperture spaced the predetermined dimension from the corresponding side of the first aperture.

3. The method of claim 2, including after the channel region deposition step, the step of depositing in the substrate via the second aperture impurities of the first or second conductivity type to form a pair of channel region sections along the opposite sides of the first channel region section.

4. The method of claim 2, including after the channel region deposition step, the step of depositing in the substrate via the second aperture impurities of the first or second conductivity type, the impurities being deposited to different concentration levels at the opposite sides of the first channel region section to form a pair of channel region sections to different threshold voltages.

5. A method for forming a semiconductor device having an electrode structure formed over a channel region in a semiconductor wafer of a first conductivity type having a major surface, comprising:
    forming an oxide layer on the major surface;
    forming source-and drain-locating cuts in the oxide layer;
    depositing impurities of the second conductivity type via the oxide cuts into the wafer to form a source and a drain therein;
    forming over the oxide layer a mask having a first aperture having sides such that the width of the aperture is less than the channel region width;
    etching the oxide layer via the first aperture to form a second aperture in the oxide layer having at least one side spaced a predetermined distance outside the corresponding side of the first aperture;
    depositing in the semiconductor wafer via the first aperture impurities of the first or the second conductivity type to form a first channel region section extending the length of the channel region and having a width smaller than the width of the channel region;
    removing the mask; and
    forming the electrode structure to encompass the second, oxide layer aperture.

6. The method of claim 5 wherein the oxide etching step forms each of opposite sides of the second aperture spaced a predetermined dimension from the corresponding side of the first aperture.

7. The method of claim 6 including after the channel region deposition step, the step of depositing in the substrate via the second aperture impurities of the first or the second conductivity type to form a pair of channel region sections along the opposite sides of the first channel region section.

8. The method of claim 6, including after the channel region deposition step, the step of depositing in the substrate via the second aperture impurities of the first or the second conductivity type, the impurities being deposited to different concentration levels at the opposite sides of the first channel region section to form a pair of channel region sections to different threshold voltages.

9. In a method for forming a semiconductor device having a channel region for forming a channel in a semiconductor body having a layer of silicon oxide covering the channel region, the improvement wherein the channel region comprises at least two sections having different threshold voltages, including a section having an effective width of a predetermined dimension, comprising:
    forming a mask over the oxide layer on the semiconductor body, the mask having a first aperture, the aperture having sides defining aperture width of a predetermined dimension;

etching the oxide layer via the first aperture to form a second aperture in the oxide layer, at least one side of the second aperture being spaced a predetermined distance outside the corresponding side of the first aperture;

depositing in the semiconductor body via the first aperture impurities of the first conductivity type to form a first channel region section extending the length of the channel region and having a width controlled by the first aperture to a dimension smaller than the channel region width;

removing the mask; and depositing in the semiconductor body via the second aperture impurities of the first conductivity type or the second conductivity type to form at least a second channel region section between the one side of the second aperture and the first channel region section.

10. The method of claim 9 wherein the first conductivity type is p-type and the second conductivity type is n-type.

11. The method of claim 10 wherein the substrate is p-type, the channel is n-type, and the first channel region section and the second channel region section are enhancement and depletion sections, respectively.

12. The method of claim 10 wherein the substrate is n-type, the channel is p-type, and the first channel region section and the second channel region sections are depletion and enhancement sections, respectively.

13. The method of claim 9 wherein the first conductivity type is n-type and the second conductivity type is p-type.

14. The method of claim 13 wherein the substrate is n-type, the channel is p-type, and the first channel region section and the second channel region section are enhancement and depletion sections, respectively.

15. The method of claim 13, wherein the substrate is p-type, the channel is n-type, and the first channel region section and the second channel region section are enhancement and depletion sections, respectively.

16. The method of claim 9, wherein the first channel region section and the second channel region sections are both enhancement or depletion sections.

17. The method of claim 9, wherein the etching step comprises etching the silicon oxide mask for a predetermined time using hydrofluoric acid etchant.

18. In a method for forming an insulated gate field effect transistor having a channel region for forming a channel in a semiconductor substrate, the improvement wherein the channel region comprises three sections, at least two of which have different threshold voltages, including a section having an effective width of a predetermined dimension, comprising:

forming on the substrate an oxide layer of suitable thickness for use as a deposition mask;

forming on the oxide layer a deposition mask having an aperture over the channel region, the aperture being of lesser width than the channel region;

etching the oxide layer by applying a liquid bath etchant thereto via the mask aperture to form an aperture in the oxide layer, the oxide layer aperture being of greater width than the deposition mask aperture;

as a first deposition step, implanting in the substrate via the deposition mask aperture impurities of a first conductivity type to form a first channel region section having a width smaller than the width of the channel region; and removing the deposition mask; and as a second deposition step, implanting in the substrate via the oxide layer aperture impurities of the second conductivity type to form a pair of second channel region sections along the sides of the first section.

19. The method of claim 18 wherein during the second deposition step the impurities are deposited to different concentration levels at the opposite sides of the first channel region section to form each of the pair of channel region sections to different threshold voltages.

20. The method of claim 18 wherein the first conductivity type is n-type and the second conductivity type is p-type.

21. The method of claim 20 wherein the substrate is p-type and the channel is n-type.

22. The method of claim 20 wherein the substrate is n-type and the channel is p-type.

23. The method of claim 22, wherein the substrate background concentration is $10^{15}$ cm$^{-3}$ phosphorus, the channel region is about four microns wide by 16 microns long, and a source and a drain are formed at opposite ends of the channel region by about $5 \times 10^{18}$ cm$^{-3}$ surface concentration of boron formed to a junction depth of about two microns, the oxide layer is formed to a depth of about two microns, and wherein:

the deposition mask aperture is formed to a width of about 4 microns;

etching the oxide layer comprises applying buffered hydrofluoric acid etchant via the deposition mask aperture for sufficient time to form the oxide layer aperture to a width of about 5 microns;

the first deposition step comprises implanting phosphorus using a dose of $3 \times 10^{12}$ cm$^{-2}$ and 50 kev; and the second deposition step comprises implanting boron using a dose of $3.5 \times 10^{12}$ cm$^{-2}$ and 20 kev;

the first and second deposition steps providing first and second channel region sections having peak concentrations of about $5 \times 10^{17}$ cm$^{-3}$ phosphorus at a depth of about 60 nanometers; and about $4 \times 10^{17}$ cm$^{-3}$ boron at a depth of 60 nanometers, respectively.

24. The method of claim 18 wherein the first conductivity type is p-type and the second conductivity type is n-type.

25. The method of claim 24 wherein the substrate is n-type and the channel is p-type.

26. The method of claim 24, wherein the substrate is p-type and the channel is n-type.

* * * * *